United States Patent
Back et al.

(10) Patent No.: US 10,077,527 B2
(45) Date of Patent: Sep. 18, 2018

(54) LIQUID SENSING APPARATUS, DETERGENT SUPPLY APPARATUS, AND WASHING MACHINE HAVING THE SAME

(71) Applicant: SAMSUNG ELECTRONICS CO., LTD., Suwon-si (KR)

(72) Inventors: Dong Il Back, Suwon-si (KR); Hyun woo Song, Hwaseong-si (KR)

(73) Assignee: SAMSUNG ELECTRONICS CO., LTD., Suwon-si (KR)

(*) Notice: Subject to any disclaimer, the term of this patent is extended or adjusted under 35 U.S.C. 154(b) by 523 days.

(21) Appl. No.: 14/090,063

(22) Filed: Nov. 26, 2013

(65) Prior Publication Data

US 2014/0144191 A1    May 29, 2014

(30) Foreign Application Priority Data

Nov. 26, 2012  (KR) .................. 10-2012-0134771

(51) Int. Cl.
*D06F 39/02* (2006.01)
*D06F 33/02* (2006.01)
*G01R 27/00* (2006.01)

(52) U.S. Cl.
CPC ............ *D06F 39/022* (2013.01); *D06F 33/02* (2013.01); *D06F 39/02* (2013.01); *G01R 27/00* (2013.01);
(Continued)

(58) Field of Classification Search
CPC ........ D06F 33/02; D06F 39/02; D06F 39/022; D06F 2204/10; D06F 2202/12; D06F 2210/00
See application file for complete search history.

(56) References Cited

U.S. PATENT DOCUMENTS 4,076,146 A * 2/1978 Lausberg ............ A47L 15/0055
                                                          222/214
4,840,341 A * 6/1989 Hasegawa ................ B42F 1/02
                                                          211/89.01
(Continued)

FOREIGN PATENT DOCUMENTS

CN    102014726 A    4/2011
CN    202543631 U   11/2012
(Continued)

OTHER PUBLICATIONS

WO2011009777A1—English translation.*
(Continued)

*Primary Examiner* — Rita P Adhlakha
(74) *Attorney, Agent, or Firm* — Staas & Halsey LLP

(57) ABSTRACT

A detergent supply apparatus, and a washing machine including the same. The washing machine includes the detergent supply apparatus which includes a detergent container accommodating housing installed in the cabinet and having an opening in the front portion of the cabinet, a detergent container configured to store the detergent and to be removably inserted into the detergent container accommodating housing through the opening of the detergent container accommodating housing, a pump unit installed outside the detergent container, and configured to pump the detergent stored in the detergent container to the detergent container accommodating housing, and a connector unit configured to supply power to the pump unit, and including a first body attached on an outer portion of the pump unit and a second body attached on the detergent container accommodating housing, the first body is electrically connected to the second body by being removably attached to the second body.

15 Claims, 16 Drawing Sheets

(52) U.S. Cl.
CPC ...... *D06F 2202/12* (2013.01); *D06F 2204/10* (2013.01); *D06F 2210/00* (2013.01)

(56) References Cited

U.S. PATENT DOCUMENTS

| | | | |
|---|---|---|---|
| 2010/0175435 A1* | 7/2010 | Shin | D06F 39/02 68/17 R |
| 2012/0073061 A1* | 3/2012 | Hendrickson | D06F 39/02 8/137 |

FOREIGN PATENT DOCUMENTS

| | | |
|---|---|---|
| DE | 10 2009 030 329 A1 | 1/2010 |
| DE | 10 2009 027 876 A1 | 1/2011 |
| EP | 1 959 045 A1 | 8/2008 |
| EP | 2 251 481 A1 | 11/2010 |
| WO | WO 2008098729 A1 * | 8/2008 ......... A47L 15/4418 |
| WO | 2009/132936 A1 | 11/2009 |
| WO | WO 2011009777 A1 * | 1/2011 ............. D06F 39/02 |

OTHER PUBLICATIONS

European Search Report dated Mar. 5, 2014 in related European Patent Application 13194034.8-1710.
European Decision on Grant dated Jan. 25, 2016 in corresponding European Patent Application No. 13194034.8.
European Search report dated Sep. 5, 2016 in corresponding European Patent Application No. 16171302.9.
Communication dated Jun. 22, 2017 in related European Patent Application No. 16171302.9.
Decision on Grant dated May 4, 2017 in related Chinese Patent Application No. 201310611128.7.
Chinese Office Action dated Nov. 28, 2016 in related Chinese Patent Application No. 201310611128.7 (6 pages) (8 pages English Translation).

* cited by examiner

LIQUID SENSING APPARATUS, DETERGENT SUPPLY APPARATUS, AND WASHING MACHINE HAVING THE SAME

CROSS-REFERENCE TO RELATED APPLICATIONS

This application claims the priority benefit of Korean Patent Application No. 10-2012-0134771, filed on Nov. 26, 2012 in the Korean Intellectual Property Office, the disclosure of which is incorporated herein by reference.

BACKGROUND

1. Field

The following description relates to a liquid sensing apparatus, a detergent supply apparatus, and a washing machine having the same, and more particularly, to an apparatus to add a detergent by supplying power to a detergent supply apparatus.

2. Description of the Related Art

A washing machine is used to wash clothes using power, and the washing machine generally includes a cabinet defining an outer appearance of the washing machine, a tub to store water, a drum rotatably disposed in the tub, and a motor to rotate the drum.

When the drum is rotated by the motor with laundry and a dissolved detergent added therein, the laundry is rubbed with the drum and mixed with the dissolved detergent so that the laundry is decontaminated.

Detergent that is used to decontaminate clothes includes a powder detergent, a liquid detergent, etc., and lately, a liquid detergent having benefits of a higher solubility than a powder detergent and non-blowability is widely used.

Typically, a user may add a detergent in a washing machine whenever doing laundry. In order to eliminate such inconvenience, a detergent supply apparatus to automatically supply a detergent has been developed.

The detergent supply apparatus includes a detergent container that may be drawn from and accommodated in a detergent container accommodating housing, and in some cases, the detergent container includes an electric device that may connect to power. In this case, the detergent container itself electrically connects to the detergent container accommodating housing. However, when the detergent container shakes, a short circuit or failure in sensing if the detergent container has been accommodated may occur.

SUMMARY

Therefore, it is an aspect of the present disclosure to provide a detergent supply apparatus including a connector unit to supply power to the detergent supply apparatus, and a washing machine including the detergent supply apparatus.

Additional aspects of the disclosure will be set forth in part in the description which follows and, in part, will be apparent from the description, or may be learned by practice of the disclosure.

In accordance with one aspect of the present disclosure, a washing machine includes: a cabinet; a tub disposed in the cabinet; and a detergent supply apparatus configured to supply a detergent to the tub, wherein the detergent supply apparatus includes: a detergent container accommodating housing installed in the cabinet, and having an opening in the front portion of the cabinet; a detergent container configured to store the detergent, and to be removably inserted into the detergent container accommodating housing through the opening of the detergent container accommodating housing; a pump unit installed outside the detergent container, and configured to pump the detergent stored in the detergent container to the detergent container accommodating housing; and a connector unit configured to supply power to the pump unit, and including a first body attached on an outer portion of the pump unit, and a second body attached on the detergent container accommodating housing, wherein the first body is electrically connected to the second body by being removably attached to the second body.

The washing machine may further include a guide unit configured to guide coupling between the first body and the second body, and to prevent the detergent container from shaking.

The guide unit may include one or more guide protrusions formed on one of the first body and the second body, and one or more accommodating grooves formed on the other one of the first body and the second body and configured to accommodate the guide protrusions.

The guide protrusions and the accommodating grooves may be respectively formed on both end portions of the first body and on both end portions of the second body.

The end portion of each guide protrusion may taper at a predetermined angle to guide coupling with the corresponding accommodating groove.

The washing machine may further include one or more slip prevention members formed on the outer surfaces of the guide projections in order to prevent the guide protrusions from slipping out of the accommodating grooves.

One or more hooks by which the accommodating grooves are caught may be formed at the ends of the guide protrusions, and one or more hook holes may be formed with shapes corresponding to the hooks in the accommodating grooves.

The first body may include a plurality of first ribs configured to guide coupling with the second body in one side, and a plurality of second ribs arranged to be opposite to the first ribs to guide coupling with the second body in the other side, and the distance between the first ribs may be different from the distance between the second ribs.

The second body may include a plurality of third ribs configured to guide coupling with the first body in one side, and a plurality of fourth ribs arranged to be opposite to the third ribs to guide coupling with the first body in the other side, and the distance between the third ribs may be different from the distance between the fourth ribs.

The pump unit may include a main body, and a pump unit cover configured to cover at least one portion of the main body, the first ribs may be coupled with a portion of the pump unit cover, and the second ribs may be coupled with a portion of the main body.

The detergent container accommodating housing may include a coupling opening into which the second body is inserted, and the coupling opening may include one or more rib grooves to accommodate at least one of the third ribs and the fourth ribs in one side.

The connector unit may include one or more connection terminals provided at the ends of one or more wires, and at least one of the connection terminals may transfer data regarding whether the detergent container has been attached to or detached from the detergent container accommodating housing.

The pump unit may be coupled with the rear portion of the detergent container, and the first body may be attached on the rear portion of the pump unit.

The washing machine may further include a controller configured to detect whether the first body has been coupled with the second body in order to control addition of the detergent.

The controller may detect whether the first body has been coupled with the second body, based on a signal generated by coupling of at least one pair of connection terminals provided in the first body and the second body.

The controller may include an electrode sensor provided in one side of the pump unit, and configured to detect whether water inflows to determine whether to operate the pump unit, and the electrode sensor may include an assembling unit to couple the electrode sensor with the pump unit, and a sensor to determine whether to operate the pump unit.

The assembling unit may be designed in the shape of a screw in which peaks and valleys are alternately arranged.

In accordance with another aspect of the present disclosure, a detergent supply apparatus includes: a detergent container configured to store a detergent; a detergent container accommodating housing configured to accommodate the detergent container therein, in which the detergent and water inflow and are mixed; and a connector unit including a first body coupled with the detergent container, and a second body coupled with the detergent container accommodating housing, and configured to electrically connect the first body to the second body to determine whether the detergent container has been accommodated in the detergent container accommodating housing based on an electrical signal.

A plurality of ribs may be formed on at least one of the first body and the second body in order to guide a direction in which the connector unit is inserted.

The plurality of ribs may include a plurality of first ribs formed on the upper portion of the first body, and a plurality of second ribs arranged to be opposite to the first ribs and formed on the lower portion of the first body, and the distance between the first ribs may be different from the distance between the second ribs.

The plurality of ribs may include a plurality of third ribs formed on the upper portion of the second body, and a plurality of fourth ribs arranged to be opposite to the third ribs and formed on the lower portion of the second body, and the distance between the third ribs may be different from the distance between the fourth ribs.

The first body and the second body may each include one or more wires, and end portions of the wires are connected to one or more connection terminals are provided, and include one or more wire accommodating parts to accommodate the wires therein.

The connector unit may include an inserting part in one side and an inserting groove in the other side so that one of the first body and the second body is accommodated in and coupled with the other one of the first body and the second body.

The detergent supply apparatus may further include a guide unit configured to guide coupling between the first body and the second body, the guide unit including one or more guide protrusions formed on both end portions of one of the first and second bodies, and one or more accommodating grooves formed on both end portions of the other one of the first and second bodies and configured to accommodate the guide protrusions therein, the accommodating grooves formed in shapes corresponding to shapes of the guide protrusions.

The detergent supply apparatus may further include one or more slip prevention members formed on the outer surfaces of the guide projections in order to prevent the guide protrusions from slipping out of the accommodating grooves.

The connector unit may include one or more first sealing members disposed in the first and second bodies, and one or more second sealing members disposed on an outer surface of the first body, in order to prevent water from entering the connector unit.

In accordance with another aspect of the present disclosure, a liquid sensing apparatus includes: an electrode sensor configured to detect liquid, and configured with one or more sensing units, wherein each sensing unit comprises a sensor configured to detect the liquid, and an assembling unit in which peaks and valleys are alternately arranged, the assembling unit configured to couple the sensing unit with the liquid sensing apparatus.

The assembling unit may be inserted into an inserting hole provided in one side of the liquid sensing apparatus, the liquid sensing apparatus further including a sealing member to prevent a water leak between the electrode sensor and the inserting hole.

Therefore, since the detergent container is prevented from shaking due to the connector unit of the detergent supply apparatus, it is possible to prevent electrical contact failure of the detergent container, and to correctly detect whether the detergent container has been accommodated in the detergent container accommodating housing.

Also, through the structure of the connector unit, it is possible to prevent water from entering the connector unit.

Furthermore, since the connector unit may not be inserted in an incorrect direction, the case in which the detergent supply apparatus or the liquid sensing apparatus does not operate due to the incorrect insertion of the connector unit may be avoided.

In addition, the electrode sensors may be easily assembled, and failure due to a water leak may also be prevented.

BRIEF DESCRIPTION OF THE DRAWINGS

These and/or other aspects of the disclosure will become apparent and more readily appreciated from the following description of embodiments, taken in conjunction with the accompanying drawings of which.

DETAILED DESCRIPTION

Hereinafter, embodiments of the present disclosure will be described in detail with reference to the accompanying drawings. In the following description, a washing machine is assumed to be a drum washing machine, however, the washing machine is not limited to a drum washing machine. Also, a detergent supply apparatus mentioned in the following description should be interpreted as having a limited meaning. That is, the detergent supply apparatus may be a liquid sensing apparatus to detect liquid other than water.

Figure 1:
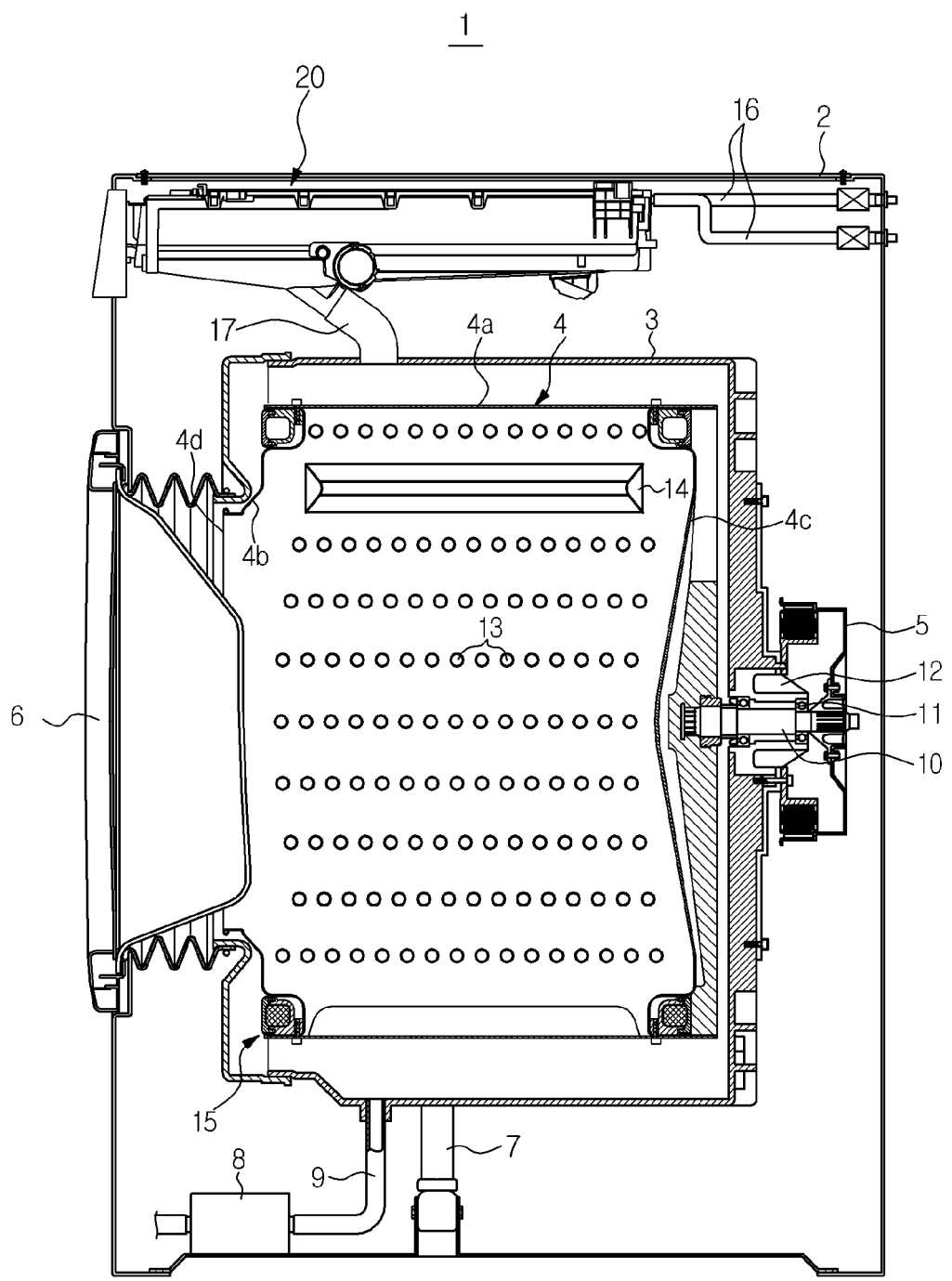
FIG. 1 is a cross-sectional view of a washing machine including a detergent supply apparatus according to an embodiment of the present disclosure.

FIG. 1 is a cross-sectional view of a washing machine 1 including a detergent supply apparatus according to an embodiment of the present disclosure.

Referring to FIG. 1, the washing machine 1 includes a cabinet 2, a tub 3 disposed in the cabinet 2, a drum 4 rotatably disposed in the tub 3, and a motor 5 to drive the drum 4.

An opening to put laundry into the drum 5 is formed in the front portion of the cabinet 2. The opening is opened and closed by a door 6 mounted on the front portion of the cabinet 2.

The tub 3 may be supported by a damper 7 or a spring (not shown). Or, there may be provided both a damper and a spring. As shown in FIG. 1, the damper 7 connects the outer lower wall of the tub 3 to the inner lower wall of the cabinet 2. The damper 7 (or the spring) functions to absorb vibrations caused by the tub 3.

Under the tub 3, a drain pump 8 and a drain pipe 9 to discharge water stored in the tub 3 out of the cabinet 2 are provided.

The drum 4 is configured with a cylinder part 4a, a front plate 4b connected to the front portion of the cylinder part 4a, and a rear plate 4c connected to the rear portion of the cylinder part 4a. The front plate 4b has an opening 4d to allow a user to put laundry therethrough, and the rear plate 4c is connected to a driving shaft 10 that transfers power to the drum 4 from the motor 5.

A plurality of through-holes 13 to fill and discharge water are formed around the drum 4 so that the inner space of the drum 4 communicates with the inner space of the tub 3.

A plurality of lifters 14 are formed on the inner circumference surface of the drum 4 so that laundry may rise and fall while the drum 4 rotates.

The driving shaft 10 is disposed between the drum 4 and the motor 5. One end portion of the driving shaft 10 is connected to the rear plate 4c of the drum 4, and the other end portion of the driving shaft 10 extends outside the rear wall of the tub 3. If the motor 5 drives the driving shaft 10, the drum 4 connected to the driving shaft 10 rotates with respect to the driving shaft 10.

A bearing housing 12 is attached on the rear wall of the tub 4 so as to rotatably support the driving shaft 10. The bearing housing 12 may be made of, for example, an aluminum alloy, and may be inserted into the rear wall of the tub 3 when the tub 3 is injection-molded. Bearings 11 are installed between the bearing housing 12 and the driving shaft 10 so that the driving shaft 10 may rotate smoothly.

When laundry is done, the motor 5 rotates the drum 4 at a low speed in forward and backward directions, and accordingly, laundry stored in the drum 4 continues to rise and fall so that dirt on the laundry is removed.

Thereafter, when spin-drying is done, the motor 5 rotates the drum 4 at a high speed in one direction so that water falls away from the laundry by a centrifugal force applied to the laundry.

At this time, if the laundry is distributed unevenly in the drum 4, unbalanced load is applied to the drum 4 so that the rotation motion of the drum 4 becomes unstable, resulting in generation of vibrations and noise.

Accordingly, the washing machine 1 may include a plurality of balancers 15 to stabilize the rotation motion of the drum 4. The plurality of balancers 15 may be respectively provided close to the front plate 4b and rear plate 4c of the drum 4.

Water supply pipes 16 to supply water to the tub 3 are provided above the tub 3. One end portions of the water supply pipes 16 are connected to an external water supply source (not shown), and the other end portion of the water supply pipes 16 is connected to the detergent supply apparatus 20.

The detergent supply apparatus 20 is connected to the tub 4 through a connecting hose 17. Water supplied through the water supply pipes 16 is supplied into the tub 4 via the detergent supply apparatus 20.

Figure 2:
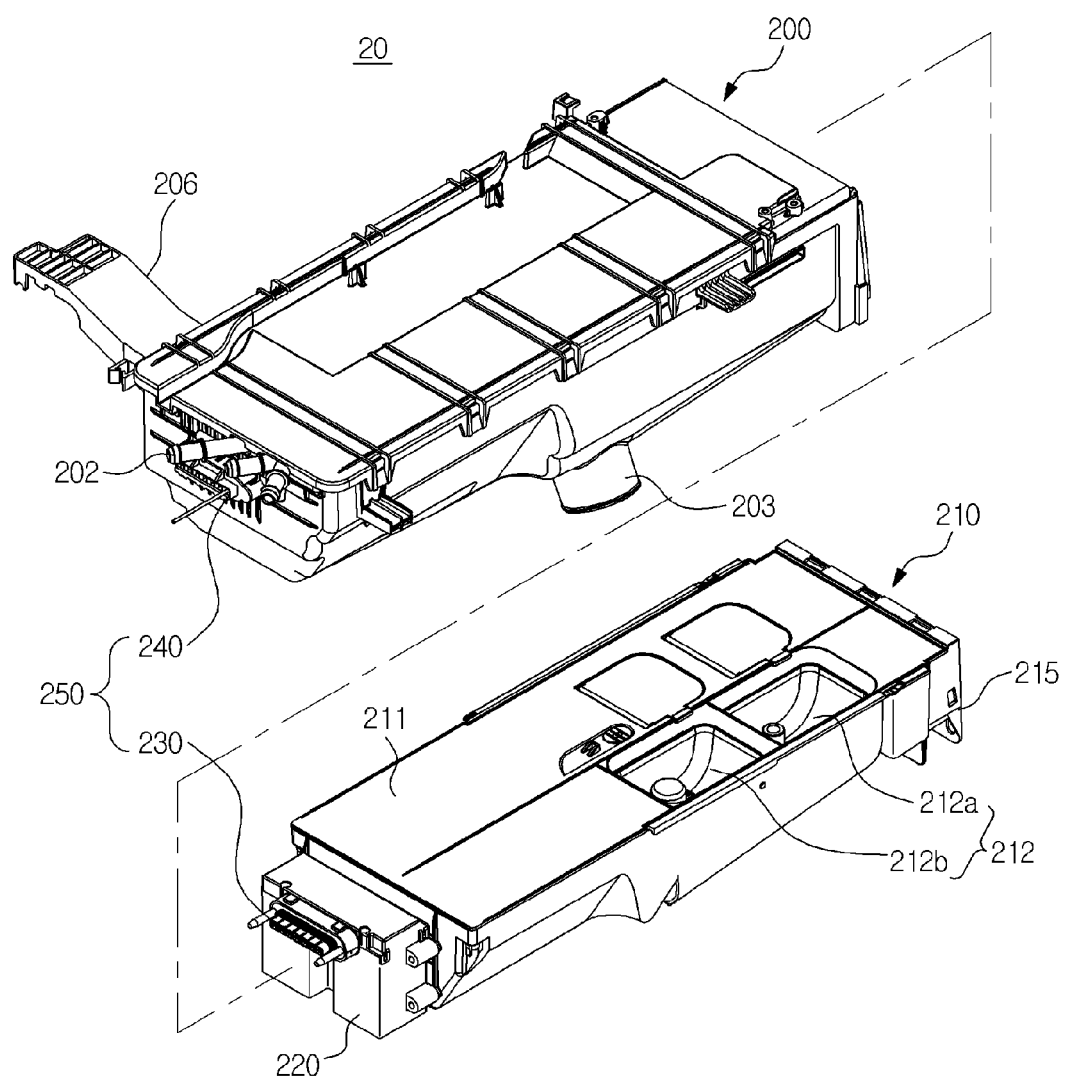
FIG. 2 is a perspective view of the detergent supply apparatus shown in FIG. 1.
Figure 3:
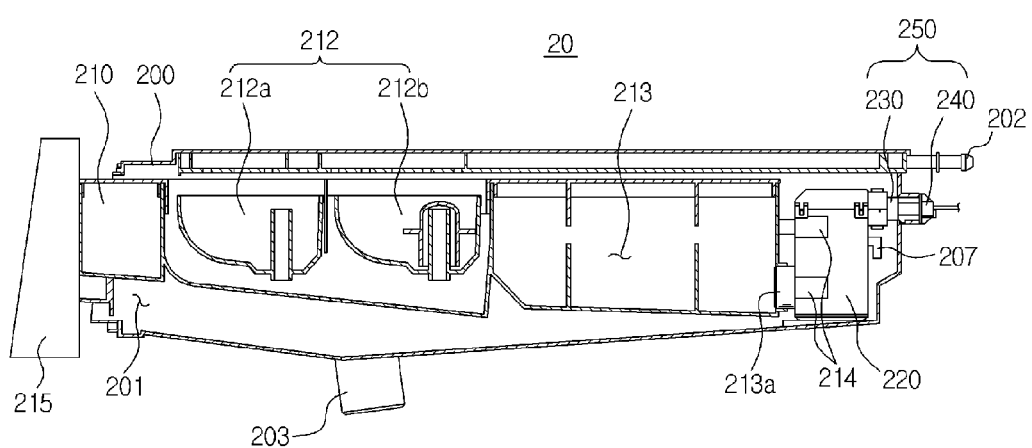
FIG. 3 is a cross-sectional view of the detergent supply apparatus shown in FIG. 2.

FIG. 2 is a perspective view of the detergent supply apparatus 20 shown in FIG. 1, and FIG. 3 is a cross-sectional view of the detergent supply apparatus 20.

As shown in FIGS. 2 and 3, the detergent supply apparatus 20 is configured to include a detergent container 210, and a detergent container accommodating housing 200 that accommodates the detergent container 210 therein.

The detergent container 210 may be installed in the detergent container accommodating housing 200 by sliding into the detergent container accommodating housing 200 through an opening 201 formed in the front portion of the detergent container accommodating housing 200.

The detergent container accommodating housing 200 is fixedly installed in the cabinet 2 of the washing machine 1 (see FIG. 1). A user adds a detergent to the washing machine 1 in such a manner to take the detergent container 210 out of the detergent container accommodating housing 200, to add a detergent in the detergent container 210, and then to put the detergent container 210 in the detergent container accommodating housing 200. As shown in the drawings, a fixing unit 206 may be configured to be caught by the cabinet 2, however, the fixing unit 206 is not limited thereto. For example, the detergent container accommodating housing 200 may be mounted to the cabinet by fastening members (not shown).

A detergent container cover 211 to prevent a detergent stored in the detergent container 210 from flowing out may be attached to the upper part of the detergent container 210. The detergent container cover 211 may include a detergent inlet 212. For example, a liquid detergent or a powder detergent, and fabric softner may be injected through the detergent inlet 212. As shown in FIGS. 2 and 3, a main detergent storage section 212a to store a main liquid detergent, and a secondary detergent storage section 212b to store a secondary liquid detergent, such as softner, bleach, etc., may be provided.

Electrical devices including electrical components may be installed in the detergent container 210. The electrical devices may be a pump unit 220 to supply a detergent to the detergent container accommodating housing 200 from the detergent container 210. The pump unit 220 may be installed outside the detergent container 210. Particularly, the pump unit 220 may be coupled with the rear portion of the detergent container 210. However, the location of the pump unit 220 is not limited to this. At least one pump (not shown) may be installed in the pump unit 220.

A channel 213 to move a detergent to the pump unit 220 may be formed behind the detergent inlet 212. The detergent moves to the pump unit 220 along the channel 213. There may be provided a plurality of channels 213 to transfer different kinds of detergents separately.

In the rear portion of the detergent container 210, at which the pump unit 220 is coupled with the detergent container 210, a through-hole 213a to transfer a detergent to the pump unit 220 is formed. Similar to the channels 213, there may be provided a plurality of through-holes 213a to transfer different kinds of detergents separately. Accordingly, there may be provided a plurality of pumps (not shown) in the pump unit 220.

In the rear portion of the detergent container 210, a coupling unit 214 to couple the detergent container 210 with the pump unit 220 may be disposed. The coupling unit 214 may be coupled with the pump unit 220 through a coupling hole (not shown) formed in the pump unit 220.

In the detergent container 210 and the detergent container accommodating housing 200, a connector unit 250 to supply power to electrical devices such as the pump unit 220 may be provided. The connector unit 250 is used to couple the detergent container 210 with the detergent container accommodating housing 200. The connector unit 250 may include a first body 230 that is attached to the detergent container 210, and a second body 240 that is attached to the detergent container accommodating housing 200. The first body 230 may be electrically connected to the second body 240 by being removably attached to the second body 240. The first body 230 may be attached to the rear portion of the detergent container 210, and the second body 240 may be positioned in the inner wall of the detergent container accommodating housing 200, at which the detergent container 210 contacts when the detergent container 210 is accommodated in the detergent container accommodating housing 200. According to an embodiment, the first body 230 may be mounted on the pump unit 220, and the second body 240 may be disposed in a coupling hole (not shown) of the detergent container accommodating housing 200. Although in FIG. 2, as a non-limiting example, the first body 230 is shown as a male connector and the second body 240 is shown as a female connector, the first body 230 may be a female connector and the second body 240 may be a male connector.

A gripping part 215 to enable a user to take the detergent container 210 in and out of detergent container accommodating housing 200 may be provided in front portion of the detergent container 210. The detergent container 210 with the detergent inlet 212 through which a detergent may be injected is positioned behind the gripping part 215. Also, the pump unit 220 to supply a detergent to the detergent container accommodating housing 200 may be connected to the rear portion of the detergent container 210. Also, the first body 230 is disposed behind the pump unit 220, and the second body 240 is disposed in the inner rear wall of the detergent container accommodating housing 200 such that the first body 230 may be coupled with the second body 240.

In a first state in which the detergent container 210 has been taken out of the detergent container accommodating housing 200 in order to add a detergent in the detergent container 210, the connector unit 250 is decoupled, and in a second state in which the detergent container 210 has been accommodated in the detergent container accommodating housing 200, the connector unit 250 is coupled. That is, in the first state, the first body 230 is decoupled from the second body 240, and in the second state, the first body 230 is coupled with the second body 240.

A connection pipe 202 to supply water to the detergent container accommodating housing 200 is connected to the detergent container accommodating housing 200. There may be provided a plurality of connection pipes 202. The connection pipes 202 may be connected to the rear portion of the detergent container accommodating hosing 200. Water supplied to the detergent container accommodating housing 200 is mixed with a detergent supplied from the detergent container 210 to the detergent container accommodating housing 200 through the pump unit 220. The detergent in the pump unit 220 may be supplied to the detergent container accommodating housing 200 through a detergent outlet 207. The water mixed with the detergent flows to the tub 3 though a water supply pipe 203 connected from the detergent container accommodating housing 200 to the tub 3. If the detergent supply apparatus 20 is disposed above the tub 3, the water supply pipe 203 may be formed in the lower portion of the detergent container accommodating housing 200.

In the second state in which the detergent container 210 has been accommodated in the detergent container accommodating 200, the first body 230 of the connector unit 250 is in a coupled state with the second body 240 of the connector unit 250. If the first body 230 is in the coupled state with the second body 240, power is supplied to the connector unit 250 so that the electric devices located in the detergent container 210 operate. For example, the pump unit 220 pumps the detergent stored in the detergent container 210 to the detergent container accommodating housing 200. Also, in the second state in which the first body 230 has been coupled with the second body 240, an electric signal is generated and transferred to a controller 270 (see FIG. 6) so as to inform a user of whether the detergent container 210 has been properly accommodated in the detergent container accommodating housing 200.

Figure 4:
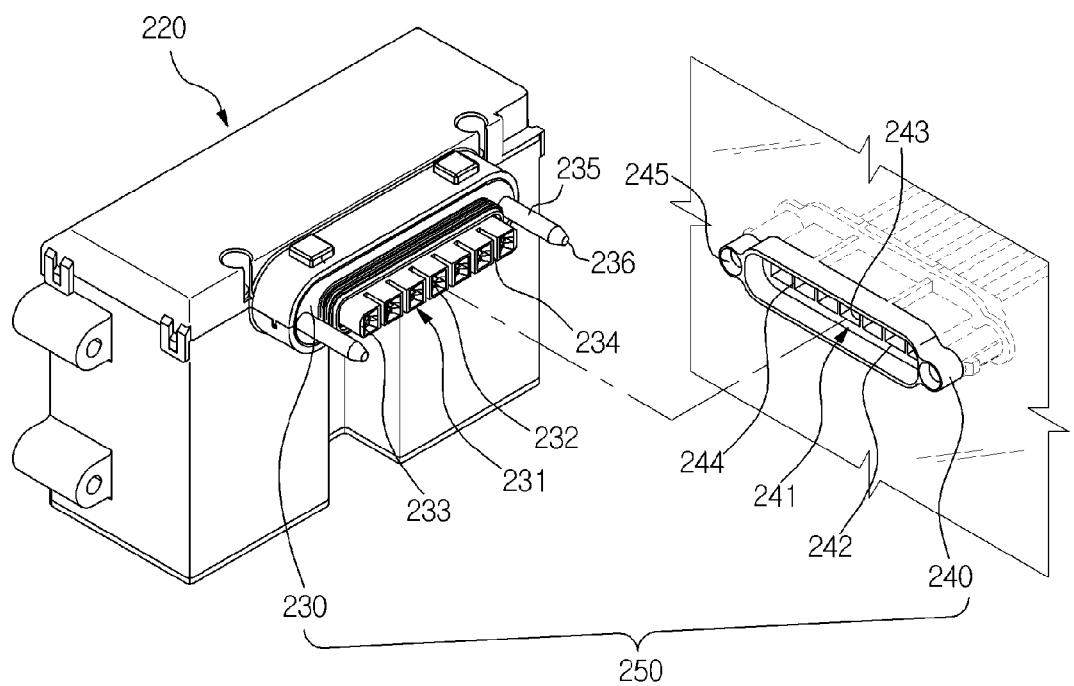
FIG. 4 is a perspective view of a connector unit according to an embodiment of the present disclosure.
Figure 5:
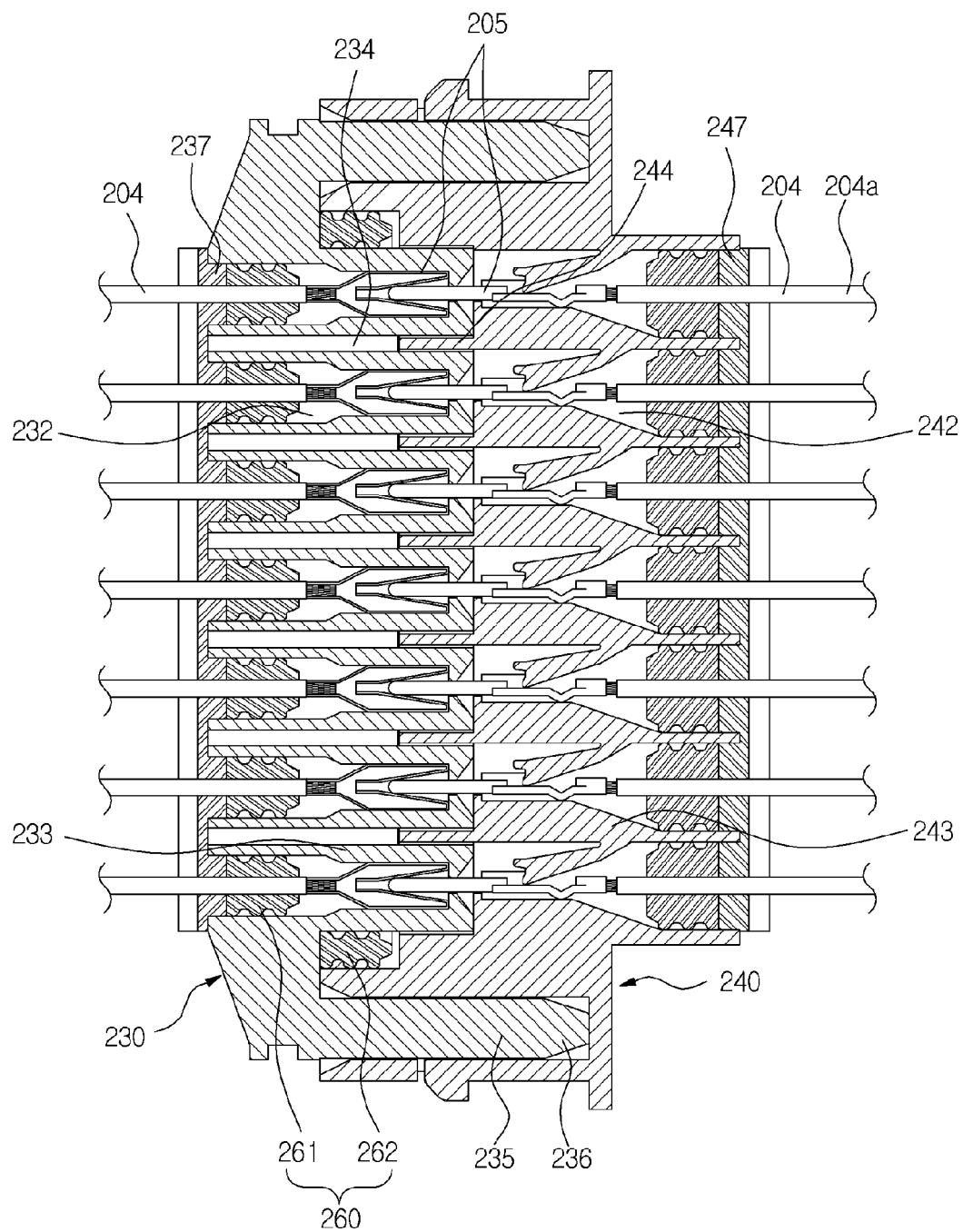
FIG. 5 is a cross-sectional view of the connector unit shown in FIG. 4.

FIG. 4 is a perspective view of the connector unit 250 according to an embodiment of the present disclosure, and FIG. 5 is a cross-sectional view of the connector unit 250.

As shown in FIGS. 4 and 5, the connector unit 250 includes the first body 230 and the second body 240. One of the first and second bodies 230 and 240 includes an inserting part 231, and the other of the first and second bodies 230 and 240 includes an inserting groove 241 so that the one of the first and second bodies 230 and 240 is accommodated in and coupled with the other of the first and second bodies 230 and 240. Each of the first and second bodies 230 and 240 includes one or more wires 204. The wires 204 each includes a conductor (not shown) made of, for example, a metal material, and a sheath 204a surrounding the conductor to isolate it. A connection terminal 205 may be provided at the end portion of the wire 204. The first and second bodies 230 and 240 may include wire accommodating parts 232 and 242 to accommodate the wires 204 respectively. The wire accommodating parts 232 and 243 may include partition walls 233 and 243 between the wires 204 in order to separately accommodate the plurality of wires. If the inserting part 231 is formed in the first body 230, a groove 234 may be formed in each partition wall between the wire accommodating parts 232 of the first body 230. Accordingly, the second body 240 may include pins 244 extending from the partition walls 243 between the wire accommodating parts 242 to be coupled with the individual grooves 234 of the first body 230.

Also, there may be provided guide units 235 and 245 to guide the coupling between the first and second bodies 230 and 240. The guide units 235 and 245 may include one or more guide protrusions 235 formed on one of the first and second bodies 230 and 240, and one or more accommodating grooves 245 formed on the other of the first and second bodies 230 and 240 and accommodating the guide protrusions 235 therein. As shown in FIGS. 4 and 5, the guide protrusions 235 may be formed in the first body 230, and the accommodating grooves 245 may be formed in the second body 240. However, it is also possible that the guide protrusions 235 are formed in the second body 240, and the accommodating grooves 245 are formed in the first body 230. The guide protrusions 235 may be formed at both end portions of the first body 230, and the accommodating grooves 245 may be provided at both end portions of the second body 240 in order to accommodate the guide protrusions 235 therein. Further, the guide protrusions 235 may be formed at the end portions of the first body 230 and the second body 240, and the accommodating grooves 245 may be provided at the end portion of the first body 230 and the second body 240 in order to accommodate the guide protrusions 235 of the first body 230 and the second body 240 therein, respectively. The end portion 236 of each guide protrusion 235 may taper at a predetermined angle. This structure is aimed at smoothly inserting the guide protrusion 235 into the corresponding accommodating groove 245.

Since the guide protrusions 235 are accommodated in the accommodating grooves 245 to guide coupling between the first and second bodies 230 and 240, the first body 230 may be easily coupled with the second body 240, and also possibility that the detergent container 210 incorrectly coupled with the detergent container accommodating housing 200 is reduced. Also, it is possible to prevent the detergent container 210 from being separated from the detergent container accommodating housing 200 even when the detergent container 210 shakes. Also, the guide protrusions 235 and the accommodating grooves 245, and the grooves 234 and the pins 244 may be aligned in the opposite locations. That is, if the guide protrusions 235 may be formed in the first body 230, the pins 244 may be formed in the second body 240. Accordingly, since the guide units 235 and 245 and the wire accommodating parts 232 and 242 are alternately coupled with each other, the first body 230 may be more strongly coupled with the second body 240.

The connector unit 250 may include sealing members 260 in predetermined spaces of the first and second bodies 230 and 240 in order to prevent water from entering the connector unit 250. The sealing members 260 may include first sealing members 261 disposed in the connector unit 250. The first sealing members 261 are positioned to surround the respective wires 204, thereby preventing condensation from occurring inside the connector unit 250. Also, the sealing members 260 may include second sealing members 262 that are disposed on the outer surface of the first body 230 or the second body 240. The second sealing members 262 may be provided in order to prevent water from entering the electric devices. In this case, the second sealing members 262 may be disposed on the outer surface of the detergent container 210 on which the electric devices such as the pump unit 220 are provided.

The connector unit 250 may include retainers 237 and 247 to prevent the connection terminals 205 from being broken or wrongly coupled due to their contacts to the detergent container accommodating housing 200 when the detergent container 210 is accommodated in the detergent container accommodating housing 200. The retainers 237 and 247 may be respectively coupled with the first and second bodies 230 and 240 from the outer surfaces of the first and second bodies 230 and 240. Accordingly, it is possible to prevent failure due to wrong operation of the connection terminals 205 installed in the first and second bodies 230 and 240, resulting in an improvement of reliability of a product.

Figure 6:
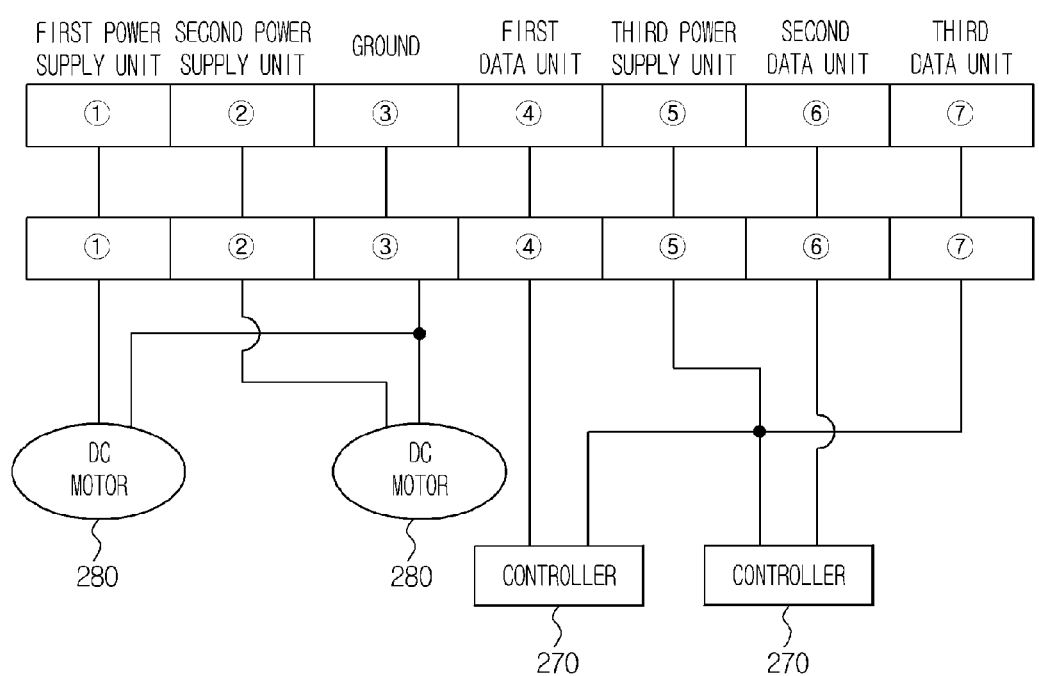
FIG. 6 schematically shows a connection relationship between connection terminals according to an embodiment of the present disclosure.

FIG. 6 schematically shows a connection relationship between the connection terminals 205 according to an embodiment of the present disclosure.

As shown in FIGS. 5 and 6, the connection terminals 205 are connected to the end portions of the wires 204 installed in the connector unit 250 so as to receive power to drive the detergent supply apparatus 20. In addition, the connection terminals 205 may transfer data regarding the state of the detergent supply apparatus 20 (see FIG. 1) to the controller 270.

Accordingly, there may be provided a plurality of connection terminals connected to a plurality of power supply units to supply power. As shown in the drawings, as a non-limiting example, there are two power supply units of a power supply unit to operate the pump unit 220, and a power supply unit to operate the controller 270. FIG. 6 shows the case in which two Direct Current (DC) motors 280 are used to operate the pump unit 220 requiring two pumps to pump two kinds of detergents so that two power supply units (that is, first and second power supply units) are provided in correspondence to the two DC motors 280. However, the number of the power supply units is not limited so long as one or more power supply units are provided. Also, a connection terminal for a ground to set a reference point of a voltage in association with the DC motors 280 may be provided.

Also, connection terminals related to data units may be provided. As shown in FIG. 6, as a non-limiting example, if two or more kinds of detergents are added, first and second data units to transmit data regarding the respective kinds of detergents may be provided. However, the number of data units is not limited so long as one or more data units related to detergents are provided. The first and second data units are connected to the respective controllers 270 to transfer the related data to the controllers 270. At least one pair of connection terminals 205 transfer an electric signal for indicating whether the detergent container 210 has been accommodated in the detergent container accommodating housing 200, to the controllers 270. As shown in FIG. 6, a third data unit is used to transfer the electric signal to the controller 270.

As such, the connector unit 250 of the detergent supply apparatus 20 may supply power to the detergent container 210 through electrical connections between the wires 204 included in the first body 230 and the wires 204 included in the second body 240, or transfer data indicating whether the detergent container 210 is in the first state or in the second state.

Figure 7:
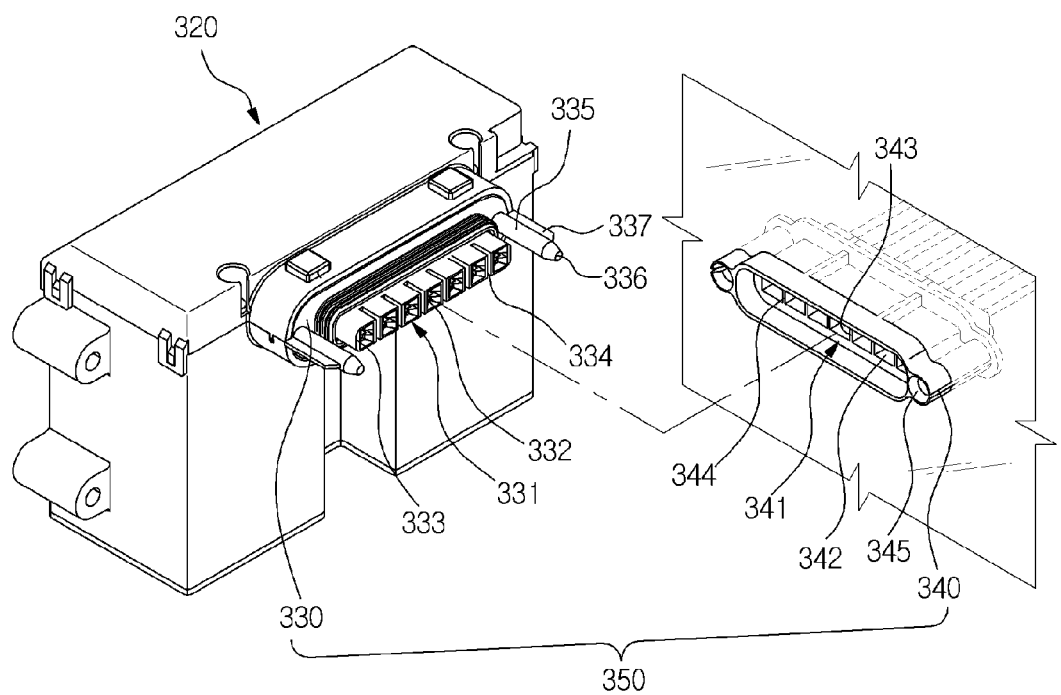
FIG. 7 is a perspective view of a connector unit according to another embodiment of the present disclosure when the connection unit is in a decoupled state.
Figure 8:
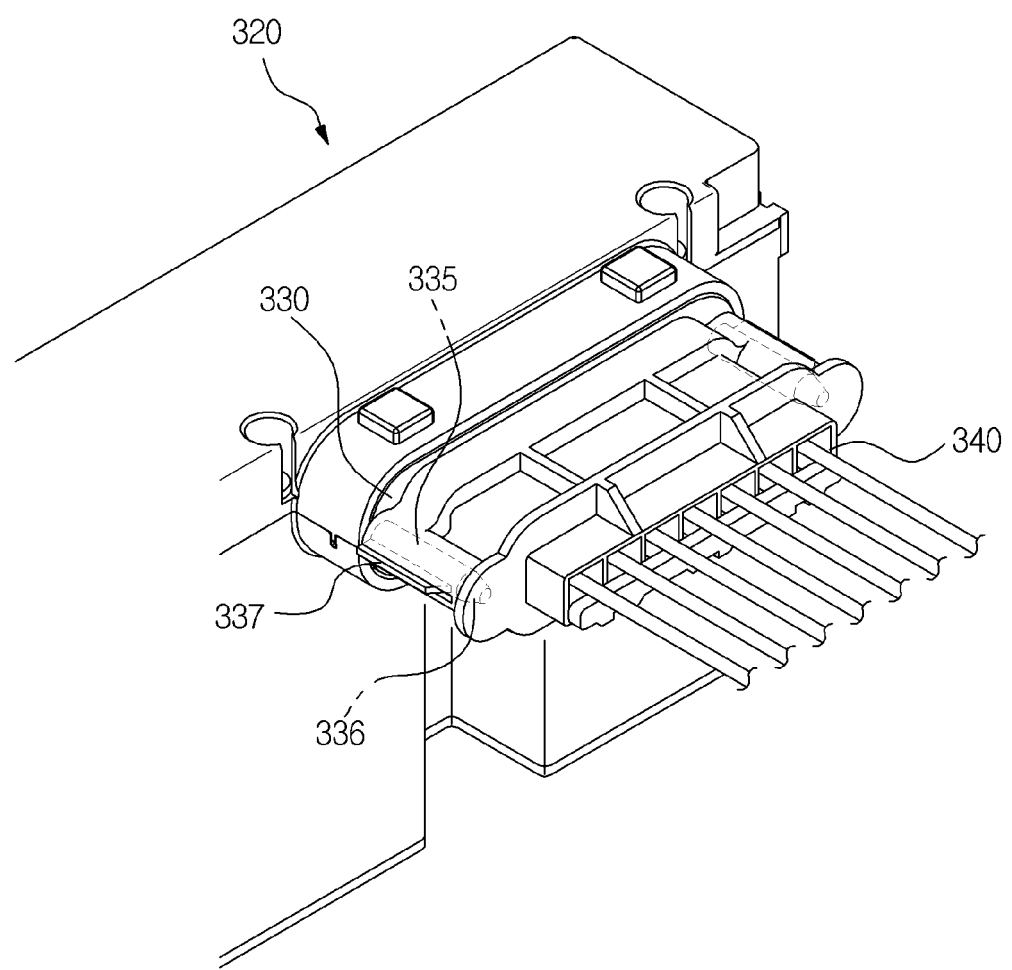
FIG. 8 is a perspective view of the connector unit shown in FIG. 7 when the connection unit is in a coupled state.

FIG. 7 is a perspective view of a connector unit 350 according to another embodiment of the present disclosure when the connection unit 350 is in a decoupled state, and FIG. 8 shows the connector unit 350 that is in a coupled state.

As shown in FIGS. 7 and 8, the connector unit 350 includes the first body 330 and the second body 340. The first body 330 may be mounted on the pump unit 320. One of the first and second bodies 330 and 340 includes an inserting part 331, and the other of the first and second bodies 330 and 340 includes an inserting groove 341 so that the one of the first and second bodies 330 and 340 is accommodated in and coupled with the other of the first and second bodies 330 and 340. The first and second bodies 330 and 340 may include wire accommodating parts 332 and 342 to accommodate wires respectively. The wire accommodating parts 332 and 342 may include partition walls 333 and 343 between the wires in order to separately accommodate the plurality of wires. If the inserting part 331 is formed in the first body 330, a groove 334 may be formed in each partition wall between the wire accommodating parts 332 of the first body 330. Accordingly, the second body 340 may include pins 344 extending from the partition walls 343 between the wire accommodating parts 342 to be coupled with the individual grooves 334 of the first body 330. Guide units 335 and 345 to guide the coupling between the first and second bodies 330 and 340 may be provided. The guide units 335 and 345 may include one or more guide protrusions 335 formed on one of the first and second bodies 330 and 340, and one or more accommodating grooves 345 formed on the other of the first and second bodies 330 and 340 and accommodating the guide protrusions 335 therein. The end portion 336 of each guide protrusion 335 may taper at a predetermined angle. The guide units 335 and 345 of the connector unit 350 may further include slip prevention members 337 to prevent the first body 330 from slipping out of the second body 340. The slip prevention members 337 are formed on the outer surfaces of the guide projections 335. Accordingly, when the first body 330 is coupled with the second body 340, the outside areas of the guide projections 335 may be coupled with the outside areas of the accommodating grooves 345. Accordingly, since the first body 330 of the connector unit 350 is firmly coupled with the second body 340, the first body 330 will be separated from the second body 340 when a predetermined amount of external force such as pulling the detergent container 310 is applied.

Figure 9:
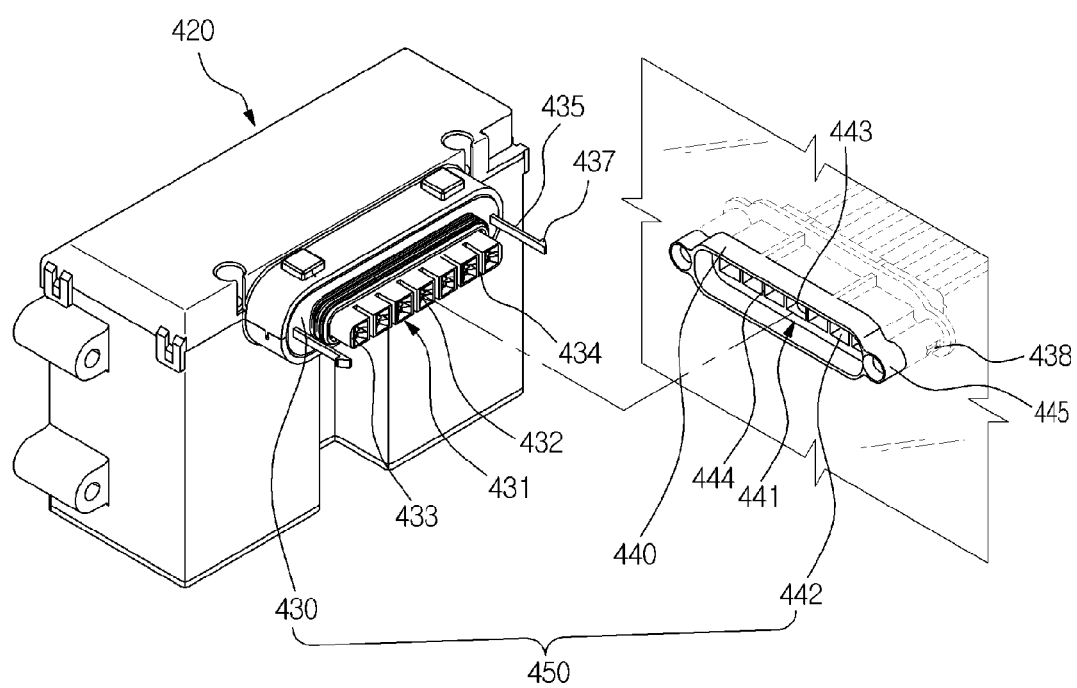
FIG. 9 is a perspective view of a connector unit according to another embodiment of the present disclosure.

FIG. 9 is a perspective view of a connector unit 450 according to another embodiment of the present disclosure.

As shown in FIG. 9, the connector unit 450 includes the first body 430 and the second body 440. The first body 430 may be mounted on the pump unit 420. One of the first and second bodies 430 and 440 includes an inserting part 431, and the other of the first and second bodies 430 and 440 includes an inserting groove 441 so that the one of the first and second bodies 430 and 440 is accommodated in and coupled with the other of the first and second bodies 430 and 440. The first and second bodies 430 and 440 may include wire accommodating parts 432 and 442 to accommodate wires respectively. The wire accommodating parts 432 and 442 may include partition walls 433 and 443 between the wires in order to separately accommodate the plurality of wires. If the inserting part 431 is formed in the first body 430, a groove 434 may be formed in each partition wall between the wire accommodating parts 432 of the first body 430. Accordingly, the second body 440 may include pins 444 extending from the partition walls 443 between the wire accommodating parts 442 to be coupled with the individual grooves 434 of the first body 430. Guide units 435 and 445 to guide the coupling between the first and second bodies 330 and 340 may be provided. The guide units 435 and 445 of the connector unit 450 may be coupled with each other according to a hook locking mechanism. Hooks 437 may be formed at the end portions of guide projections 435 of the first body 430, and hook holes 438 by which the hooks 437 is caught may be formed in accommodating grooves of the second body 440. Accordingly, the hooks 437 of the first body 430 are caught by the hook holes 438 of the second body 440. As such, the guide units 435 and 445 may be coupled with each other in various manners.

Figure 10:
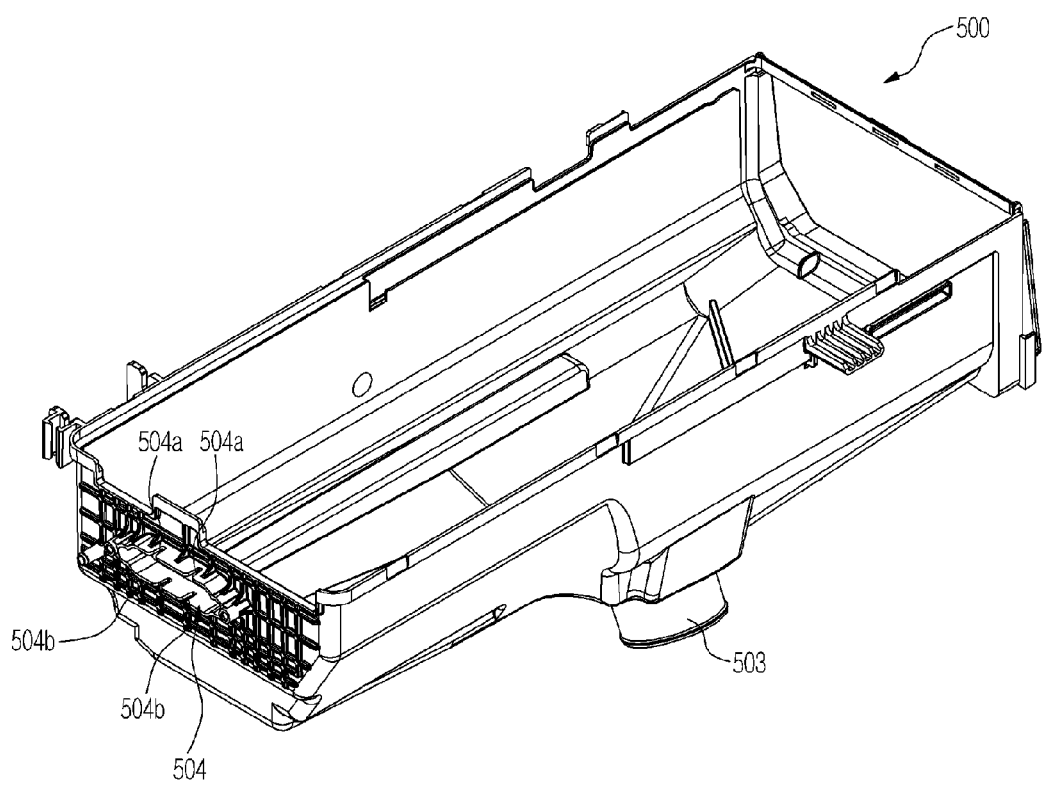
FIG. 10 is a perspective view of a detergent container accommodating housing according to an embodiment of the present disclosure.
Figure 11:
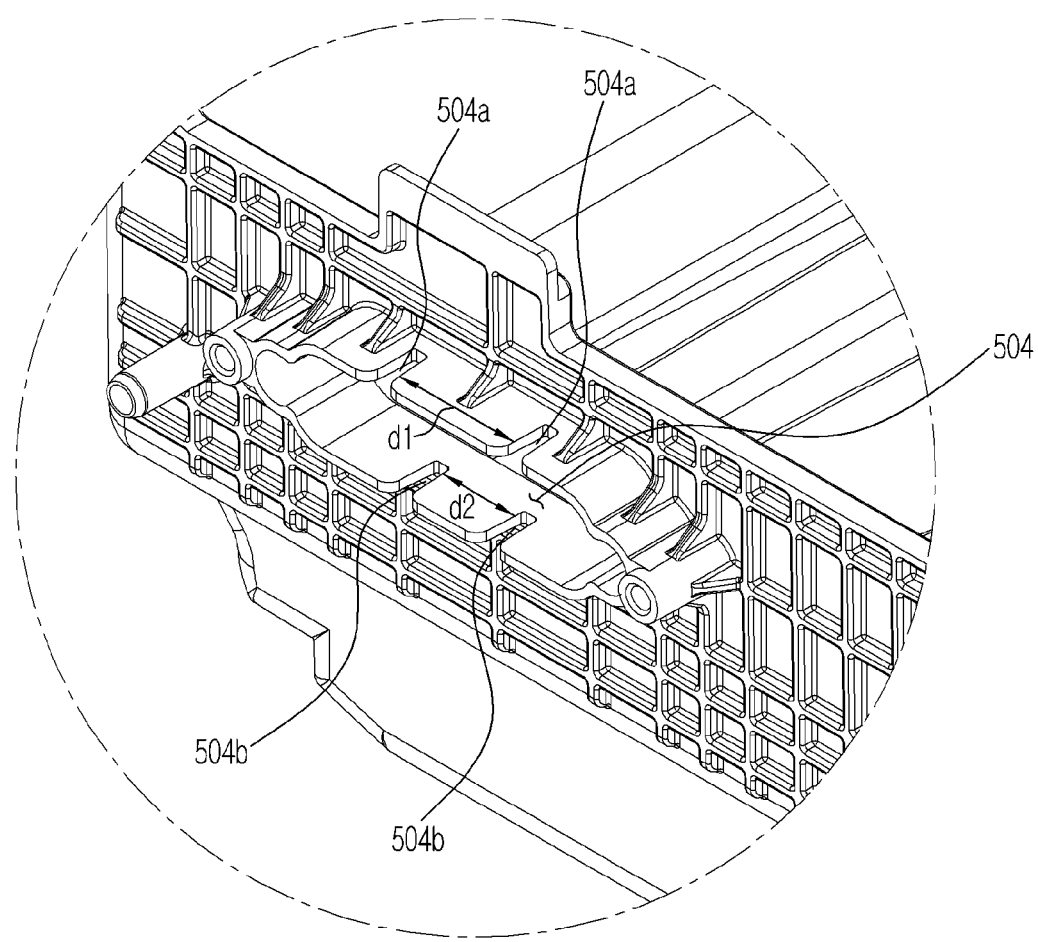
FIG. 11 is an enlarged view of a part of the detergent container accommodating housing shown in FIG. 10.
Figure 12:
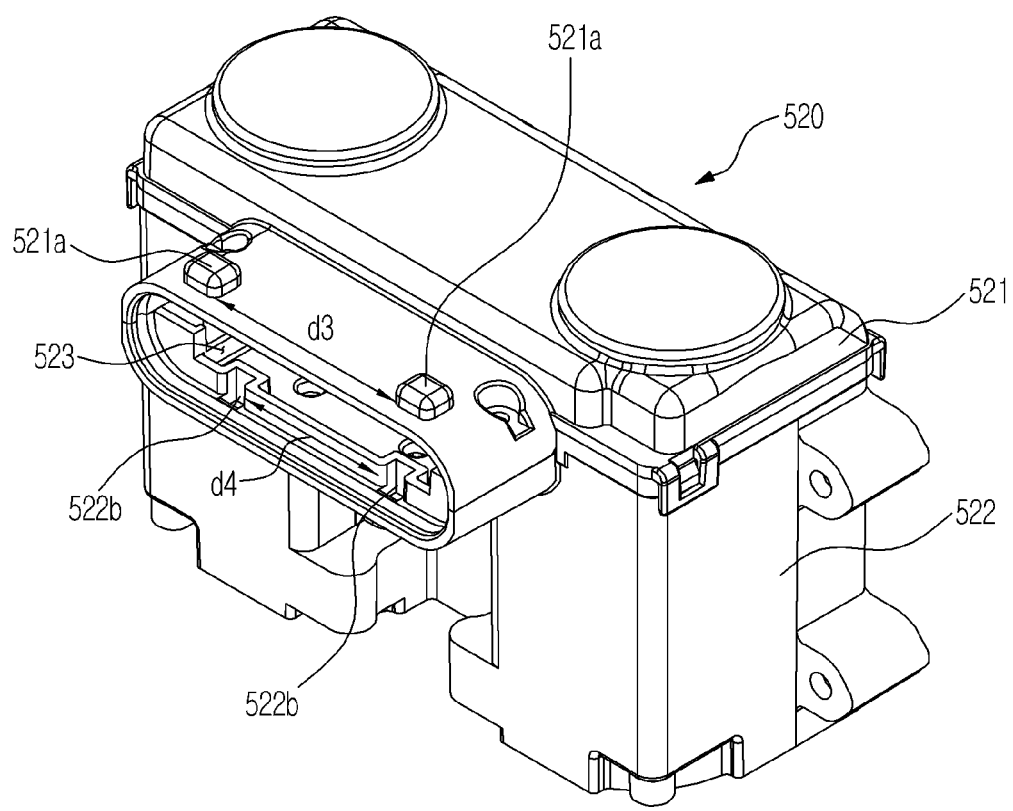
FIG. 12 is a perspective view of a pump unit according to an embodiment of the present disclosure.
Figure 13A:
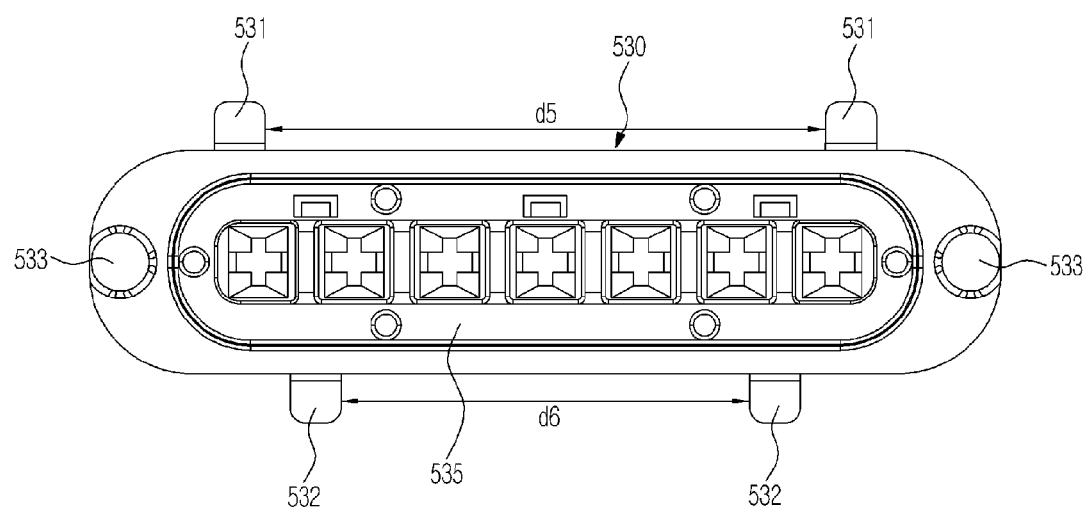
FIGS. 13A and 13B respectively show a first body and a second body of a connector unit according to another embodiment of the present disclosure.
Figure 13B:
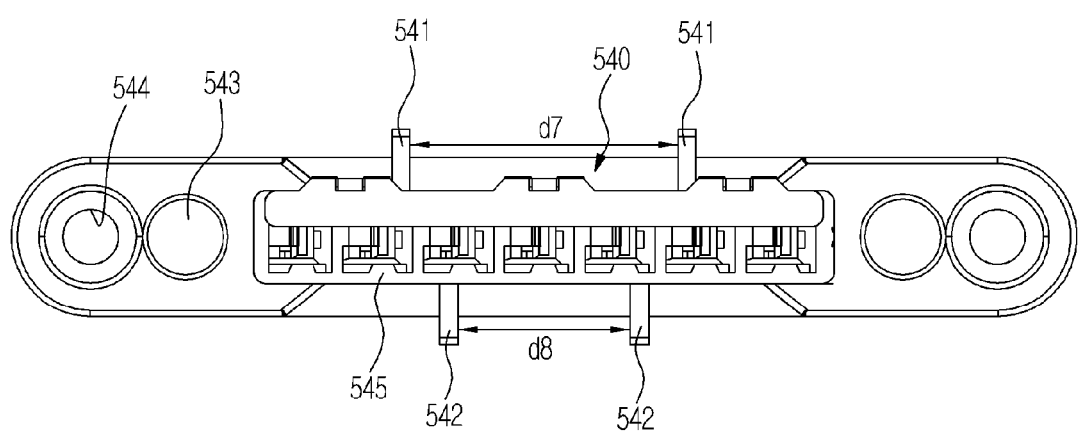

FIG. 10 is a perspective view of a detergent container accommodating housing 500 according to an embodiment of the present disclosure, FIG. 11 is an enlarged view of a part of the detergent container accommodating housing 500 shown in FIG. 10, FIG. 12 is a perspective view of a pump unit 520 according to an embodiment of the present disclosure, and FIGS. 13A and 13B show a first body 530 and a second body 540 of a connector unit according to another embodiment of the present disclosure.

As shown in FIGS. 10 through 13B, in the rear portion of the detergent container accommodating housing 500, a coupling opening 504 into which the second body 540 of a connector unit will be inserted may be formed. The water mixed with the detergent flows to the tub though a water supply pipe 503 connected from the detergent container accommodating housing 500 to the tub.

The pump unit 520 may include a main body 522, and a pump unit cover 521 to cover at least one portion of the main body 522. According to an embodiment, the first body 530 may be coupled with at least one part of the main body 522 and the pump unit cover 521.

The first body 530 may include an inserting part 535 into which the second body 540 is inserted. Also, guide projections 533 to guide coupling with the second body 540 may be formed at both end portions of the inserting part 535.

The first body 530 may include a plurality of first ribs 531 to guide coupling with the second body 540 in one side, and a plurality of second ribs 532 arranged to be opposite to the first ribs 531 to guide coupling with the second body 540 in the other side. As shown in the drawings, the first ribs 531 are formed on the upper portion of the first body 530, and the second ribs 532 are formed on the lower portion of the first body 530. There are provided two first ribs 531 and two second ribs 532. However, the positions and numbers of the first and second ribs 531 and 532 are not limited thereto. For example, one or more than two first and second ribs may be formed in the first body 530.

The distance d5 between the first ribs 531 may be different from the distance d6 between the second ribs 532. As shown in FIG. 13A, the distance d5 between the first ribs 531 is longer than the distance d6 between the second ribs 532, however, it is also possible that the distance d5 between the first ribs 531 is equal to or shorter than the distance d6 between the second ribs 532.

A plurality of first rib grooves 521a that are coupled with the first ribs 531 are formed in one side of the pump unit cover 521, and a plurality of second rib grooves 522b that are coupled with the second ribs 532 are formed in one side of the main body 522. When the first body 530 is coupled with the pump unit 520, the first ribs 531 are coupled with the first rib grooves 521a, and the second ribs 532 are coupled with the second rib grooves 522b. For this, the first rib grooves 521a may be formed in shapes corresponding to the first ribs 531, and the second rib grooves 522b may be formed in shapes corresponding to the second ribs 532. Also, the distance d5 between the first ribs 531 may be equal to the distance d3 between the first rib grooves 521a. Likewise, the distance d6 between the second ribs 532 may be equal to the distance d4 between the second rib grooves 522b. As such, since the distance d5 between the first ribs 531 is different from the distance d6 between the second ribs 532, the first ribs 531 may be coupled with one side of the pump unit cover 521, and the second ribs 532 may be coupled with one side of the main body 522. That is, since the distance d5 between the first ribs 531 is different from the distance d6 between the second ribs 532, it is possible to prevent the first body 530 from being incorrectly coupled with the pump unit 520 in the up and down direction or in the left and right direction.

Inserting grooves 545 may be formed in the second body 540. Also, in both end portions of the second body 540, locking member coupling holes 544 to couple the second body 540 with the detergent container accommodating housing 500 using locking members (not shown) may be formed. Also, accommodating grooves 543 to accommodate guide protrusions 533 of the first body 530 therein may be formed in both end portions of the second body 540. As shown in the drawings, the accommodating grooves 543 may be aligned in the inner sides than the locking member coupling holes 544 with respect to the second body 540. However, the positions of the accommodating grooves 543 are not limited so long as the accommodating grooves 543 are aligned to face the guide protrusions 533 of the first body 530 so that the guide protrusions 533 may be inserted into the accommodating grooves 543.

The second body 540 may include a plurality of third ribs 541 to guide coupling with the first body 530 in one side, and a plurality of fourth ribs 542 arranged to be opposite to the third ribs 541 in the other side. As shown in FIG. 13B, the fourth ribs 542 are formed on the lower portion of the second body 540, and the third ribs 541 are formed on the upper portion of the second body 540. There are provided two third ribs 541 and two fourth ribs 542. However, the positions and numbers of the third and fourth ribs 541 and 542 are not limited thereto.

The distance d7 between the third ribs 541 is different from the distance d8 between the fourth ribs 542. As shown in FIG. 13B, the distance d7 between the third ribs 541 is longer than the distance d8 between the fourth ribs 542, however, it is also possible that the distance d7 between the third ribs 541 is equal to or shorter than the distance d8 between the fourth ribs 542.

In one side of the detergent container accommodating housing 500, a plurality of third rib grooves 504a that are coupled with the third ribs 541, and a plurality of fourth rib grooves 504b that are coupled with the fourth ribs 542 may be formed. When the second body 540 is inserted into the detergent container accommodating housing 500, the third ribs 541 are coupled with the third rib grooves 504a, and the fourth ribs 542 are coupled with the fourth rib grooves 504b. For this, the third rib grooves 504a are formed in shapes corresponding to the third ribs 541, and the fourth rib grooves 504b are formed in shapes corresponding to the fourth ribs 542. Also, the distance d7 between the third ribs 541 may be equal to the distance d1 between the third rib grooves 504a. Likewise, the distance d8 between the fourth ribs 542 may be equal to the distance d2 between the fourth rib grooves 504b. As such, since the distance d7 between the third ribs 541 is different from the distance d8 between the fourth ribs 542, the third ribs 541 may be coupled with the fourth ribs 542 at a predetermined location on the detergent container accommodating housing 500. Accordingly, it is possible to prevent the second body 540 from being wrongly coupled with the detergent container accommodating housing 500 in the up and down direction or in the left and right direction.

Figure 14:
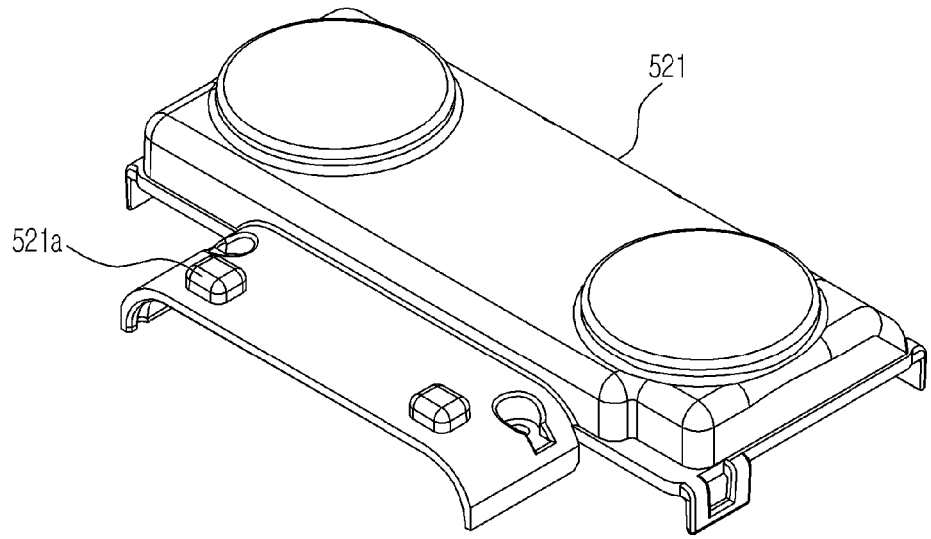
FIG. 14 is a perspective view of the pump unit shown in FIG. 12 when the pump unit cover of the pump unit is opened.
Figure 14:
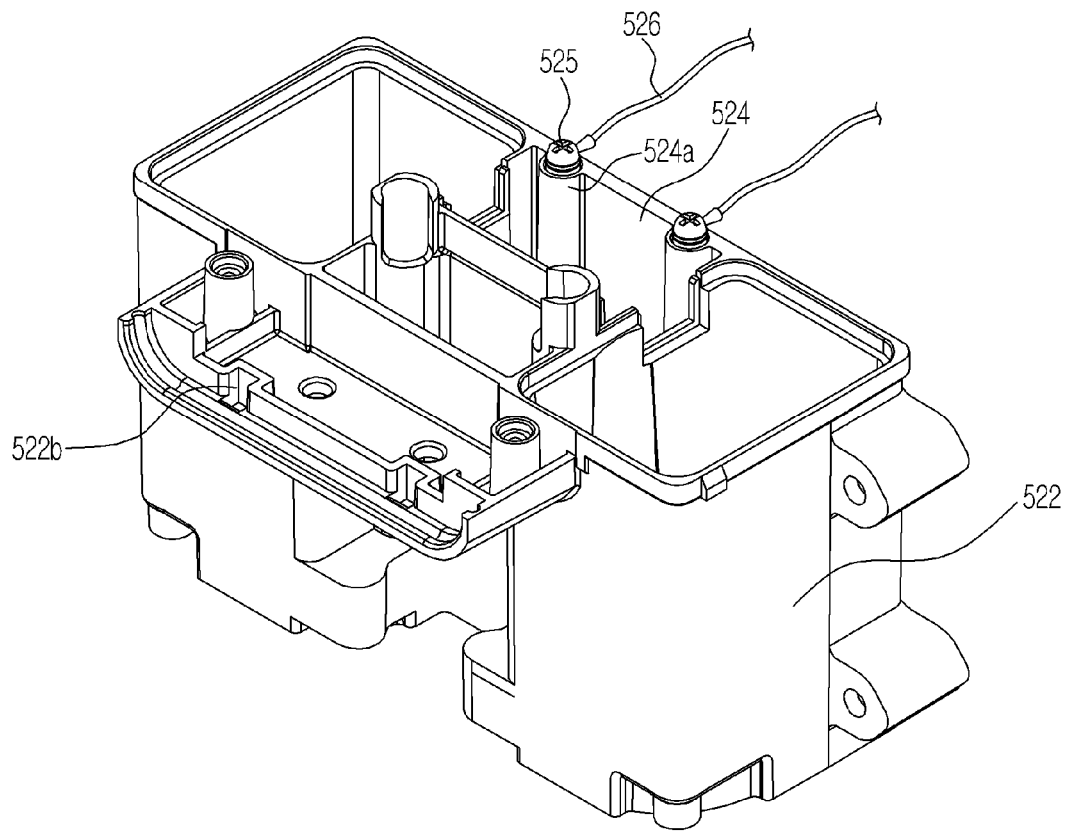
Figure 15:
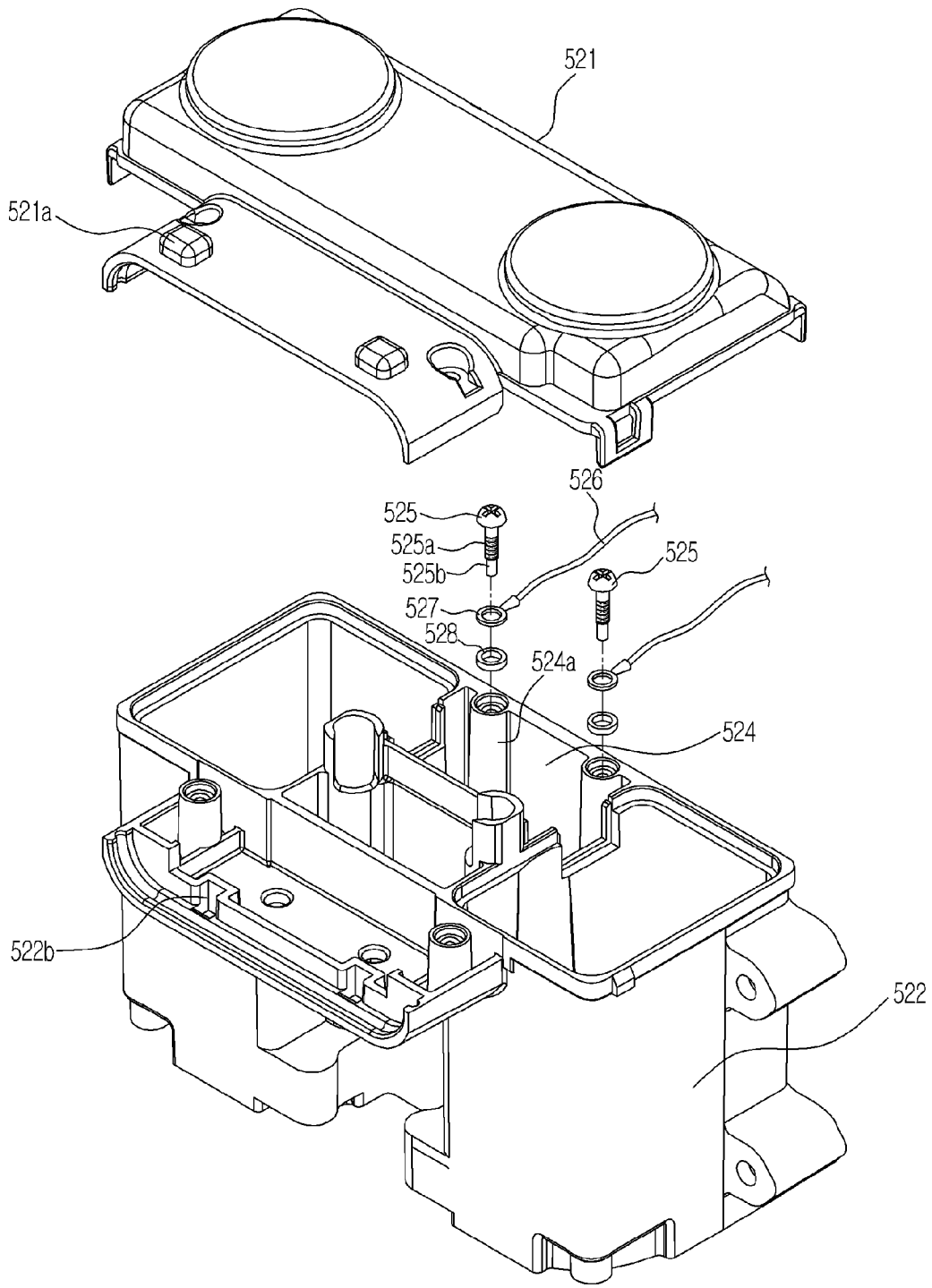
FIG. 15 is an exploded perspective view of the pump unit shown in FIG. 14.

FIG. 14 is a perspective view of the pump unit 520 shown in FIG. 12 when the pump unit cover 521 of the pump unit 520 is opened, and FIG. 15 is an exploded perspective view of the pump unit 520.

As shown in FIGS. 14 and 15, in one side of the pump unit 520, an electrode sensor 523 to detect whether water inflows to determine whether to operate the pump unit 520 may be provided. The electrode sensor 523 is a kind of controller to control addition of detergent.

The electrode sensor 523 may be coupled with the main body 522 of the pump unit 520. The main body 522 includes a sensor positioning unit 524 in which the electrode sensor 523 is installed, and the sensor positioning unit 524 may be formed in the shape of a hole. The electrode sensor 523 is configured with one or more sensors 525, and in the example shown in FIGS. 14 and 15, two sensor positioning units 524 are provided since two sensors 525 are provided.

Each sensor unit 525 may include a sensor 525b for sensing liquid, and an assembling unit 525a for coupling the sensor unit 525 with the sensor positioning unit 524. As shown in FIG. 15, the sensor 525b may be positioned in one end of the sensor unit 525, however, the location of the sensor 525b is not limited to this. If a voltage is applied to the sensor units 525 and liquid exists between the sensor units 525, the sensor units 525 apply current so that the circuit senses existence of liquid to thereby operate the pump unit 520.

In order to prevent the sensor units 525 from slipping out of the sensor positioning units 524, the diameter of the assembling unit 525a is designed to be longer than that of the sensor 525b. The assembling units 525a may have a structure in which peaks and valleys are alternately arranged in order to increase a coupling force with respect to the sensor positioning units 524. That is, the assembling units 525a may be designed in the shape of a screw having spiral grooves.

A terminal 527 connected to a wire 526 to transfer electricity may be disposed between each sensor unit 525 and the corresponding sensor positioning unit 524. Also, a third sealing member 528 may be provided together with the terminal 527, in order to prevent liquid such as water entered the pump unit 520 from moving upward to get through the electric device.

That is, the terminal 527 and the third sealing member 528 are coupled with the sensor unit 525 in this order, and then, the sensor unit 525 is coupled with the sensor positioning unit 524. Since the assembling unit 525a of the sensor unit 525 is designed in the shape of a screw in which peaks and valleys are alternately arranged, the sensor unit 525 may be coupled with the sensor positioning unit 524 using a tool such as a driver. Accordingly, since the sensor unit 525 may be easily coupled with the sensor positioning unit 524, productivity may be improved, and a coupling force between the sensor unit 525 and the sensor positioning unit 524 may be also enhanced.

Although a few embodiments of the present disclosure have been shown and described, it would be appreciated by those skilled in the art that changes may be made in these embodiments without departing from the principles and spirit of the disclosure, the scope of which is defined in the claims and their equivalents.

What is claimed is:
1. A washing machine comprising:
a cabinet;

a tub disposed in the cabinet; and a detergent supply apparatus configured to supply detergent to the tub, the detergent supply apparatus comprising:

a detergent housing installed in the cabinet for accommodating a detergent container, and having an opening at a front side of the detergent housing;

a connection pipe provided to the detergent housing to supply water into the detergent housing;

the detergent container configured to store the detergent, and to be removably inserted into the detergent housing through the opening of the detergent housing;

a detergent container cover coupled to an upper side of the detergent container;

a detergent inlet provided to the detergent container cover to fill the detergent into the detergent container through the detergent inlet;

a pump unit coupled to the detergent container, and configured to pump the detergent stored in the detergent container to the detergent housing;

a water supply pipe provided to the detergent housing to supply water mixed with the detergent into the tub; and a connector unit configured to supply power to the pump unit, the connector unit including:

a first connector disposed at a rear side of the detergent container, and a second connector disposed at an inside of the detergent housing so that, as the detergent container is inserted into the detergent housing, the first connector couples to the second connector to form an electrical connection between the first connector and the second connector, thereby to supply the power to the pump unit through the electrical connection between the first connector and the second connector of the connector unit;

at least one guide protrusion formed on one of the first connector and the second connector;

at least one accommodating groove formed on the other one of the first connector and the second connector, so that, as the detergent container is inserted into the detergent housing, the at least one guide protrusion is coupled to the corresponding at least one accommodating groove to guide the coupling of the first connector and the second connector to form the electrical connection; and a sealing member disposed between the first connector and the second connector while the first connector and the second connector are coupled to each other.

2. The washing machine according to claim 1, wherein the at least one guide protrusion and the at least one accommodating groove are respectively formed on both side portions of the first connector and on both side portions of the second connector.

3. The washing machine according to claim 1, wherein an end portion of the at least one guide protrusion tapers at a predetermined angle to guide coupling with the corresponding at least one accommodating groove.

4. The washing machine according to claim 1, wherein the guide protrusion further comprises at least one slip prevention member formed on outer surfaces of the at least one guide protrusion so that the at least one slip prevention member provides additional support to secure the coupling of the detergent container and the detergent housing together and prevents the at least one guide protrusion from slipping out of the at least one accommodating groove.

5. The washing machine according to claim 1, wherein the at least one guide protrusion further includes at least one hook formed at ends of the at least one guide protrusion, and at least one hook hole are formed with shapes corresponding to the hooks in the at least one accommodating groove so that when the detergent container is inserted into the detergent housing, the at least one hook is caught into the corresponding at least one hook hole to securely couple the detergent container to the detergent housing together.

6. The washing machine according to claim 1, wherein the first connector includes a plurality of first ribs configured to guide coupling with the pump unit in one side, and a plurality of second ribs arranged to be opposite to the first ribs to guide coupling with the pump unit in another side, and the distance between the first ribs is different from the distance between the second ribs.

7. The washing machine according to claim 6, wherein the second connector includes a plurality of third ribs configured to guide coupling with the detergent housing in one side, and a plurality of fourth ribs arranged to be opposite to the third ribs to guide coupling with the detergent housing in another side, and the distance between the third ribs is different from the distance between the fourth ribs.

8. The washing machine according to claim 6, wherein:
the pump unit includes:
a main body, and
a pump unit cover configured to cover at least one portion of the main body, and
the first ribs are coupled with a portion of the pump unit cover, and the second ribs are coupled with a portion of the main body of the pump unit.

9. The washing machine according to claim 7, wherein the detergent housing further includes a coupling opening into which the second connector is inserted, and the coupling opening includes one or more rib grooves to accommodate at least one of the third ribs and the fourth ribs in one side of the coupling opening.

10. The washing machine according to claim 1, wherein the connector unit includes one or more connection terminals provided at ends of one or more wires, and at least one of the connection terminals transfers data regarding whether the detergent container has been attached to or detached from the detergent housing.

11. The washing machine according to claim 1, wherein the pump unit is coupled with a rear portion of the detergent container, and the first connector is attached on a rear portion of the pump unit.

12. The washing machine according to claim 1, further comprising a controller configured to detect whether the first connector has been coupled with the second connector in order to control supply of the detergent.

13. The washing machine according to claim 12, wherein the controller detects whether the first connector has been coupled with the second connector, based on a signal generated by coupling of at least one pair of connection terminals provided in the first connector and the second connector.

14. The washing machine according to claim 12, wherein the controller comprises an electrode sensor provided in one side of the pump unit, and configured to detect water inflows to determine whether to operate the pump unit, and the electrode sensor comprises an assembling unit to couple the electrode sensor with the pump unit, and a sensor to determine whether to operate the pump unit.

15. The washing machine according to claim 14, wherein the assembling unit is formed in the shape of a screw in which peaks and valleys are alternately arranged.

\* \* \* \* \*